US010366770B1

(12) United States Patent
Kurosawa et al.

(10) Patent No.: US 10,366,770 B1
(45) Date of Patent: Jul. 30, 2019

(54) BIT ERROR RATE ESTIMATION FOR NAND FLASH MEMORY

(71) Applicant: Toshiba Memory Corporation, Tokyo (JP)

(72) Inventors: Yasuhiko Kurosawa, Kanagawa (JP); Avi Steiner, Kiriat Motzkin (IL); Hanan Weingarten, Herzliya (IL)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/908,318

(22) Filed: Feb. 28, 2018

(51) Int. Cl.
G11C 16/06 (2006.01)
G11C 16/34 (2006.01)
G11C 16/12 (2006.01)
G11C 29/52 (2006.01)

(52) U.S. Cl.
CPC .......... *G11C 16/349* (2013.01); *G11C 16/12* (2013.01); *G11C 16/3454* (2013.01); *G11C 29/52* (2013.01)

(58) Field of Classification Search
CPC .............. G11C 11/5628; G11C 16/349; G11C 16/3495; G11C 29/028; G11C 29/52; G11C 16/3418; G11C 16/0483; G11C 16/12; G11C 16/28; G11C 16/32; G11C 16/3422; G11C 2029/5004
USPC ............ 365/185.18, 185.09, 185.11, 185.19, 365/185.22, 185.24, 185.2, 185.33
See application file for complete search history.

(56) References Cited

U.S. PATENT DOCUMENTS

| 8,879,325 | B1 | 11/2014 | Bar et al. |
| 9,069,659 | B1 | 6/2015 | Sabbag et al. |
| 9,195,592 | B1 | 11/2015 | Weingarten et al. |
| 2012/0216085 | A1 | 8/2012 | Weingarten et al. |
| 2013/0339586 | A1 | 12/2013 | Weingarten et al. |
| 2015/0085571 | A1* | 3/2015 | Hu ........................ G11C 16/26 365/185.03 |

* cited by examiner

*Primary Examiner* — Thong Q Le
(74) *Attorney, Agent, or Firm* — Foley & Lardner LLP

(57) ABSTRACT

The present embodiments relate to methods for estimating bit error rates (BERs) associated with a flash memory. According to certain aspects, embodiments provide estimating the BER of multi-bit flash memories during the programming of the flash memory, and providing the estimated BER in a readable status register of the flash memory, thereby improving the speed of programming of the flash memory.

24 Claims, 6 Drawing Sheets

BIT ERROR RATE ESTIMATION FOR NAND FLASH MEMORY

TECHNICAL FIELD

The present embodiments relate generally to memory devices and more particularly to techniques for estimating bit error rates for NAND flash memory devices.

BACKGROUND

As the number and types of computing devices continues to expand, so does the demand for memory used by such devices. Memory includes volatile memory (e.g. RAM) and non-volatile memory. One popular type of non-volatile memory is flash memory or NAND-type flash. A NAND flash memory array includes rows and columns (strings) of cells. A cell may include a transistor.

During a read operation, an entire row/page of the NAND flash memory array is read. This is done by applying a bias voltage to all rows not being read and a reference threshold voltage to the row that should be read. The bias voltage allows the transistor of the NAND flash memory array to fully conduct. The cells lying on the row being read will conduct only if the threshold voltage is sufficiently high to overcome the trapped charge in the floating gate. A sense amplifier is connected to each string which measures the current through the string and outputs either a "1" or a "0" depending whether the current passed a certain threshold.

Typically, a programming operation includes a process of multiple small charge injection steps. A charge may be injected to a cell by applying a voltage pulse (Vpulse), starting at a voltage Vstart, to the row being programmed and setting the gate voltages of all other transistors in the string to a bias voltage (Vbias). After applying a voltage pulse, the programmed cell is read (using the procedure described above) and compared to the desired programming voltage. If the desired programming voltage is reached, the programming ends. Else, additional pulses are provided—until reaching the desired programming voltage or until reaching a maximum number of pulses (NPP). If, after the maximum number of pulses is used, there remain cells that did not pass the verify test (i.e. they were not programmed to the desired programming voltage), a program error (or failure) can be declared. The NAND flash memory described above can have bit error rates (BER) associated with programming the cells, where the BER describes the reliability of the memory.

SUMMARY

The present embodiments relate to methods for estimating bit error rates (BERs) associated with a flash memory. According to certain aspects, embodiments provide estimating the BER of multi-bit flash memories during the programming of the flash memory, and providing the estimated BER in a readable status register of the flash memory, thereby improving the speed of programming of the flash memory.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein.

DETAILED DESCRIPTION

According to certain aspects, the present embodiments relate to techniques for obtaining high endurance and high performance programming of NAND-type flash memory devices.

As set forth above, a programming operation of a NAND flash device includes a process of multiple small charge injection steps. A charge may be injected to a cell by applying a voltage pulse (Vpulse), to the row being programmed and setting the gate voltages of all other transistors in the string to a bias voltage (Vbias). After applying a voltage pulse, the programmed cell is read and compared to the desired programming voltage threshold. If the desired programming voltage is reached, the programming ends.

Figure 1:
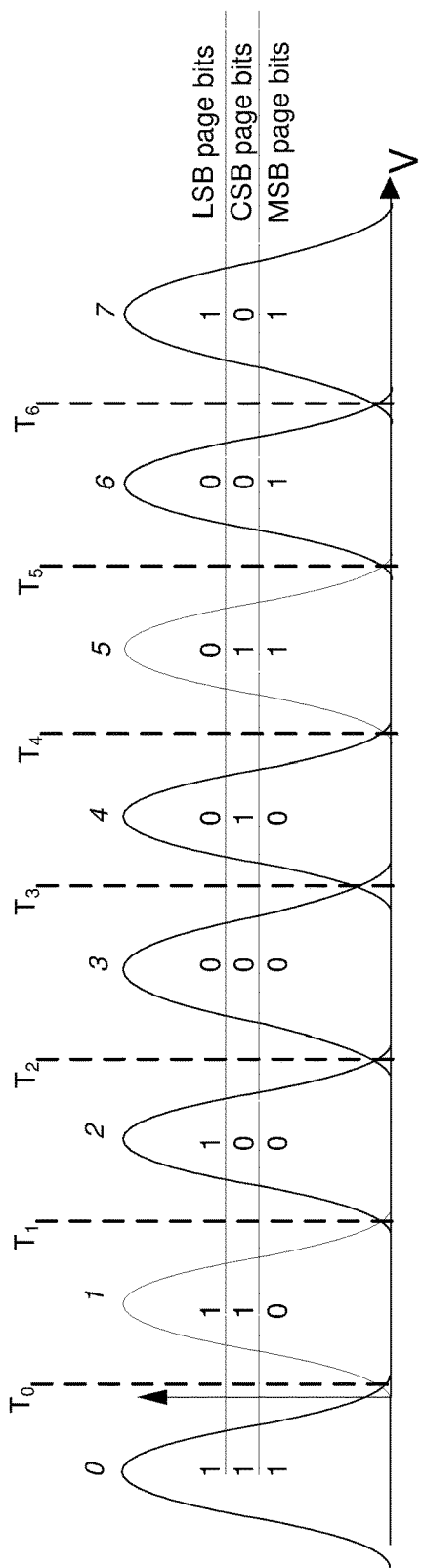
FIG. 1 illustrates threshold voltage distribution in a conventional three bits per cell (bpc) flash device.

FIG. 1 illustrates a voltage threshold distribution of a three bits per cell (bpc) flash memory device. The voltage threshold (VT) distribution includes eight lobes. An MSB page read requires using thresholds T0, T4. For reading CSB pages the read thresholds T1, T3 and T5 are used. For reading LSB pages the read thresholds T2 and T6 have to be used. The lower most distribution is known as the erase level.

The lobes shown in FIG. 1 are non-overlapping, however in practice the lobes may overlap. The overlapping can be due to the retention effect. More particularly, the repeated programming and erasing of flash memory cells (i.e. P/E cycles) cause charges to be trapped in the flash memory cells. These charges can reduce the cell program time (tProg) and can introduce errors in the programming and reading processes, which can undesirably increase a bit-error-rate (BER) of the NAND flash device. Some NAND flash device controllers can estimate the bit error rate by reading the data programmed into the device and comparing the data to the programmed data. However, this process consumes considerable amount of time, and therefore is not feasible during programming the device.

In this regard, the present Applicant recognizes that conventional approaches to estimating BER of a NAND flash device are time consuming. Moreover, the conventional approaches typically do not provide BER during programming. Instead, the controllers generally provide one bit of information that simply indicates whether the programming process was a success or not. The following discusses methods and systems for estimating the BER during a P/E cycle. The BER can be estimated for a block within the device, and the block can be marked for optimization based on a comparison of the estimated BER with a threshold value.

The present Applicant also recognizes that one factor in programming performance is endurance. Impacting this factor is the fact that, given the same fixed programming parameters used over the lifetime of a flash memory device, program time and corresponding bit error rates (BERs) change as function of the number of P/E cycles. More particularly, at high P/E cycles, the program time (tProg) is usually much shorter than the tProg of the first few P/E cycles (as much as approximately 20% lower), and it also results in higher BER. One approach to maintaining the endurance at a steady and stable write performance is to adapt programming parameters over the lifetime of the device. Adapting programming parameters is, in part, based on an estimate of the BER during programming, such as, for example, determining the blocks with unacceptable BER. The following discusses systems and methods to adapt programming parameters based on the estimation of BER during programming P/E cycles.

Figure 2:
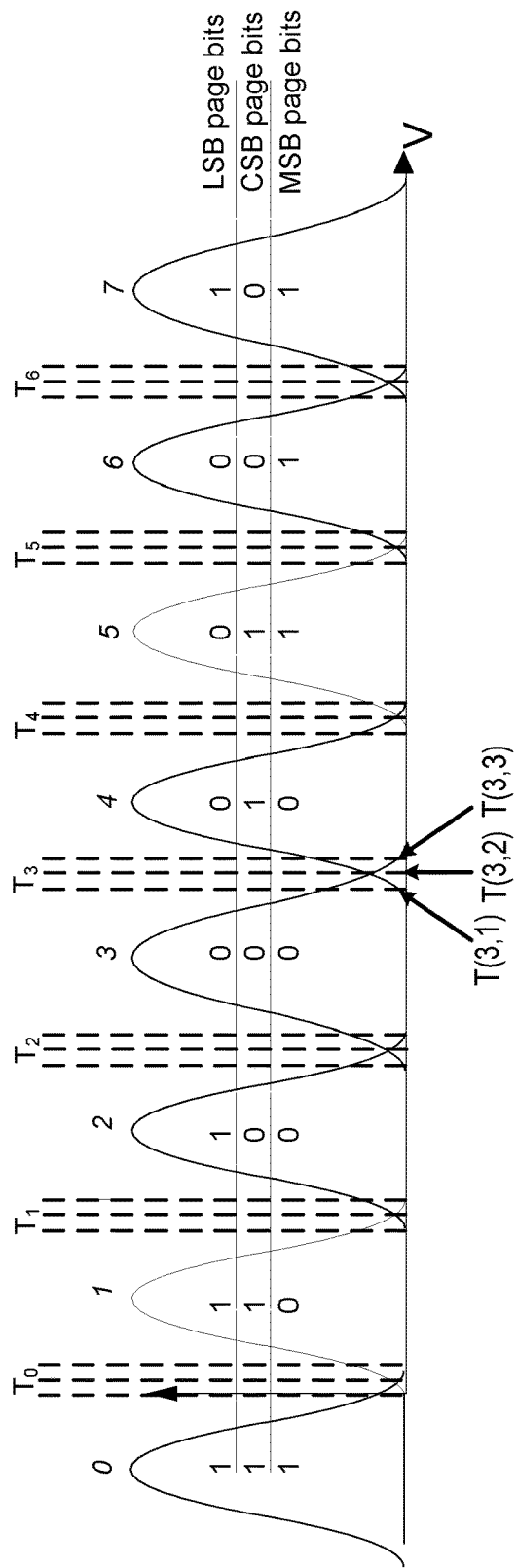
FIG. 2 illustrates voltage threshold distribution of a three bpc flash memory device for BER estimation according to embodiments.

FIG. 2 illustrates voltage threshold distribution of a three bits per cell (bpc) flash memory device for BER estimation. The voltage threshold distribution shown in FIG. 2 is similar to that shown in FIG. 1. However, the voltage distribution in FIG. 3 includes three verify threshold values for each voltage threshold. For example, for the third threshold voltage $T_3$, the three verify threshold values include T(3,1), T(3,2), and T(3,3). While FIG. 2 shows three verify threshold values per state, it is understood that the number of verify threshold values can be at least two, and can include more than three values per voltage threshold. Increasing the number of verify threshold values per state can improve the accuracy of the estimated BER. In one or more implementations, the selection of the number of verify threshold values per state can be based on the desired accuracy of the estimated BER. Referring again to the three verify threshold values for the third voltage threshold $T_3$, the verify threshold values are related such that T(3,1)<T(3,2)<T(3,3). In some implementations, the difference between adjacent verify threshold values of the three verify threshold values can be about 50 mV to about 150 mV or about 100 mV. The difference between thresholds is configured according to the expected Vt (voltage threshold) distribution of each program level right after programming, which is when the BER is estimated. The difference between thresholds is set in order to capture the region of expected errors, and also detect the un-expected errors, outside the thresholds' span, like exemplified in Table 1. In some implementations, the magnitudes of differences between two adjacent verify threshold values can be equal, while in some other implementations, the magnitudes of differences can be unequal. In some implementations, the verify threshold value T(3,2) can be equal to the third threshold voltage $T_3$. These verify threshold values can be predetermined and stored in the device, and can be accessed during programming/erase cycles of one or more blocks of the NAND flash device.

Figure 3:
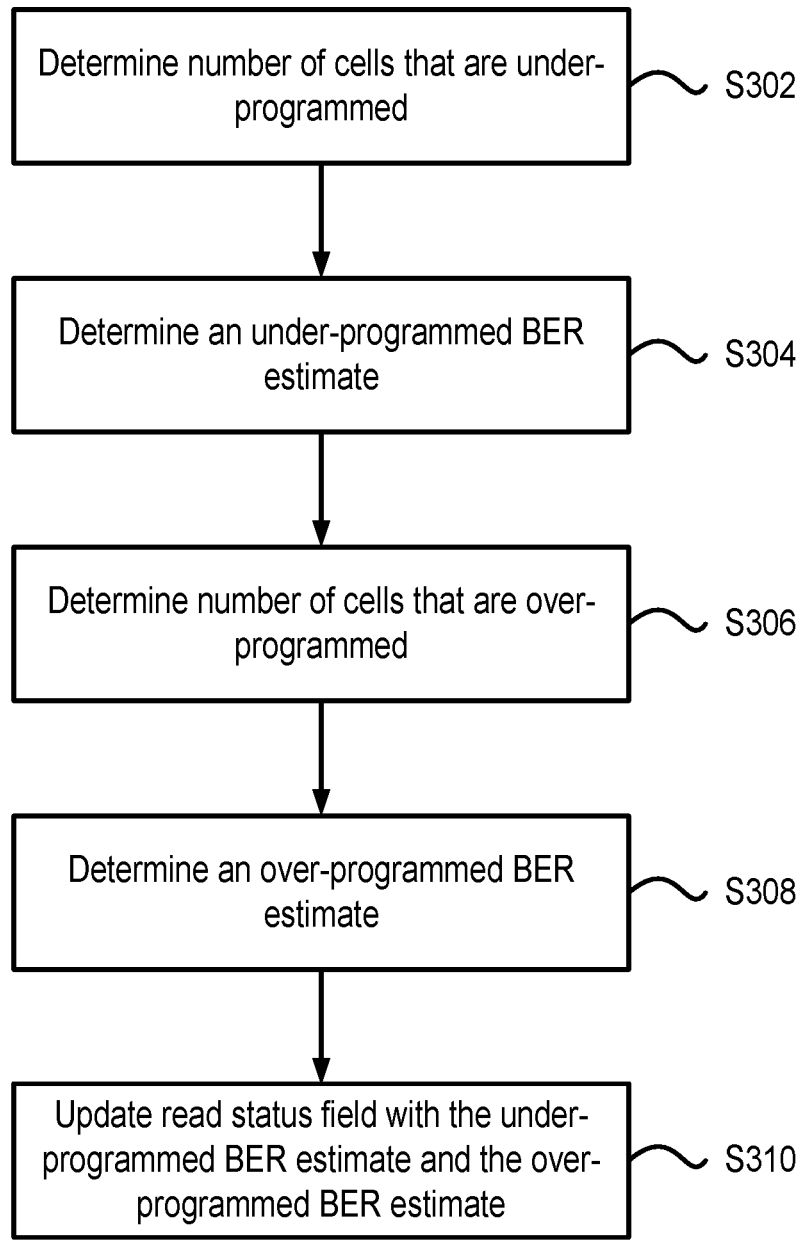
FIG. 3 is an example methodology for estimating BER for a NAND flash device according to embodiments.

FIG. 3 is an example methodology for estimating BER for a NAND flash device according to embodiments. The example methodology can be executed by program-verify logic to estimate the BER for one or more blocks within the NAND flash device during programming of the one or more blocks. The first step S302 includes determining a number of cells that are under-programmed. In particular, the number of under programmed cells associated with a voltage threshold can be determined in the first step. Referring to FIG. 2, the number of cells that are under programmed for the third voltage threshold $T_3$ can be determined when the cells are programmed with the fourth state. While programming the fourth state, the program-verify logic can compare the voltage levels at each cell within a block to the three specified verify threshold levels T(3,1), T(3,2), and T(3,3) to determine the number of cells that have voltage values that are below each of these threshold values. For example, a number of cells N(4,i) can denote the number of cells below a threshold i (selected from the three threshold values T(3,1), T(3,2), and T(3,3)) when programming the fourth state. These number of cells can be compared to a threshold value BERTH to determine a two bit BER estimate value. For example, Table 1 below shows the BER estimate values for various comparisons between the number of cells N(4,i) and the threshold value BERTH.

TABLE 1

| Condition | BER (BER binary value) |
|---|---|
| N(4,1) > BERTH | 3 (11) |
| N(4,1) ≤ BERTH | 2 (10) |
| N(4,2) ≤ BERTH | 1 (01) |
| N(4,3) ≤ BERTH | 0 (00) |

Table 1 estimates the BER based on the number of cells that have a voltage that is below a particular voltage threshold and a BERTH value. For example, if the number of cells N(4,1) in a block that have voltages below the threshold T(3,1) is greater than a threshold value BERTH, that block can be expected to have a high BER. Therefore, the estimated BER for this condition is set to a high value, e.g., 3 ('11' in 2-bit binary). The BER estimate is represented as a two bit value, to accommodate the four conditions. It should be noted that the number of bits for representing the BER can be fewer or greater based on the number of threshold levels and the resulting number of conditions. Table 1 also estimates the BER values for other conditions. For example, if the number of cells N(4,1) that have voltages less than the threshold voltage T(3,1) is less than or equal to the BERTH value, then the estimated BER can have a value 2; if the number of cells N(4,2) that have voltages less than the threshold voltage T(3,2) is less than or equal to the BERTH value, then the estimated BER can have a value 1; and if the number of cells N(4,3) that have voltages less than the threshold voltage T(3,3) is less than or equal to the BERTH value, then the estimated BER can have a value 0.

The next step S304 includes determining an under-programmed BER estimate. The program-verify logic determines an under-programmed BER estimate for each voltage threshold ($T_0$-$T_6$). For example, the program-verify logic can determine a value for the under-programmed BER estimate, passTHBER(th), for each voltage threshold (th), where the passTHBER(th) corresponds to the BER estimate value for that voltage threshold (th) determined using a table similar to the Table 1 corresponding to that voltage threshold. For example, if the program-verify logic determines that the BER estimate value for the third voltage threshold $T_3$, as determined using Table 1, is equal to 3, the program-verify logic can set the passTHBER(3) value to be equal to 3. The program-verify logic can similarly determine the under-programmed BER estimates for each of the other voltage thresholds (th). Based on the passTHBER(th) values for all the voltage thresholds, the program-verify logic can determine the passTHBER value for the block by determining the greatest passTHBER(th) of all the voltage thresholds (th). Specifically, the under-programmed BER estimate value passTHBER for the block can be expressed in Equation (1) below:

$$\text{passTHBER} = \max_{th=0 \ldots 6} \{\text{passTHBER}(th)\} \quad (1)$$

As an example, if the passTHBER(4) were equal to 3, while the passTHBER(th) associated with all other voltage thresholds were equal to 3 or less, the passTHBER for the block would be equal to 3. In this manner, the program-verify logic can determine the under-programmed BER estimate for the block.

The next step S306 includes determining the number of cells that are over-programmed. Referring to FIG. 2, the number of cells that are over-programmed in relation to the third voltage threshold $T_3$ can be determined when the cells are programmed with the third state. While programming the third state, the program-verify logic can compare the voltage levels at each cell within a block to the three specified verify threshold levels T(3,1), T(3,2), and T(3,3) to determine the number of cells that have voltage values that are above each of these threshold values. For example, a number of cells N(3,i) can denote the number of cells above a threshold i (selected from the three threshold values T(3,1), T(3,2), and T(3,3)) when programming the third state. These number of cells can be compared to a threshold value BERTH to determine a two bit BER estimate value. For example, Table 2 below shows the BER estimate values for various comparisons between the number of cells N(3,i) and the threshold value BERTH.

TABLE 2

| Condition | BER |
|---|---|
| N(3,3) > BERTH | 3 (11) |
| N(3,3) ≤ BERTH | 2 (10) |
| N(3,2) ≤ BERTH | 1 (01) |
| N(3,1) ≤ BERTH | 0 (00) |

Table 2 estimates the BER based on the number of cells that have a voltage that is above a particular voltage threshold and a BERTH value. For example, if the number of cells N(3,3) in a block that have voltages above the voltage threshold T(3,3) is greater than the threshold value BERTH, the block can be expected to have a high BER. Therefore, the estimated BER for this condition is set to a high value e.g., 3 ('11' in 2-bit binary). Similarly, if the number of cells N(3,3) that have voltages greater than the threshold voltage T(3,3) is less than or equal to the BERTH value, then the estimated BER has a value 2; if the number of cells N(3,2) that have voltages greater than the threshold voltage T(3,2) is less than or equal to the BERTH value, then the estimated BER has a value 1; and if the number of cells N(3,1) that have voltages greater than the threshold voltage T(3,3) is less than or equal to the BERTH value, then the estimated BER has a value 0.

The next step S308 includes determining an over-programmed BER estimate. The program-verify logic, similar to determining the under-programmed BER estimate for each voltage threshold ($T_0$-$T_6$), also determines the over-programmed BER estimate for each of these voltage thresholds. For example, the program-verify logic can determine a value of opTHBER(th) for each voltage threshold (th), where the opTHBER(th) corresponds to the BER estimate value for that voltage threshold (th) determined using Table 2. The program-verify logic can then determine the opTHBER value for the block by determining the greatest opTHBER(th) of all the voltage thresholds (th). Specifically, the over programmed BER estimate value opTHBER for the block can be expressed in Equation (2) below:

$$\text{opTHBER} = \max_{th=0 \ldots 6} \{\text{opTHBER(th)}\} \quad (2)$$

As an example, if the opTHBER(3) were equal to 3, while the opTHBER(th) associated with all other voltage thresholds were equal to 3 or less, the opTHBER for the block would be equal to 3. In this manner, the program-verify logic can determine the over-programmed BER estimate for the block.

In one or more embodiments, the BERTH value can be determined from an expected number of errors per voltage threshold. As an example, a row in a block can include 16,384 bytes and about 10% spare area. If the target BER is equal to about 2E-4, then for each voltage threshold the expected BER can be about 1E-4, which is equivalent to about 8 single-sided errors per threshold. Therefore, the BERTH can be selected to be equal to about 8.

The next step S310 includes updating read status field with the estimated under-programmed and over-programmed BER estimates. The NAND flash device can include one or more read status field registers that can provide status information after a programming operation. The program-verify logic can output the BER estimates via the read status register, which can be read by a programming circuit (e.g. program DSP) in a controller, for example.

Figure 4:
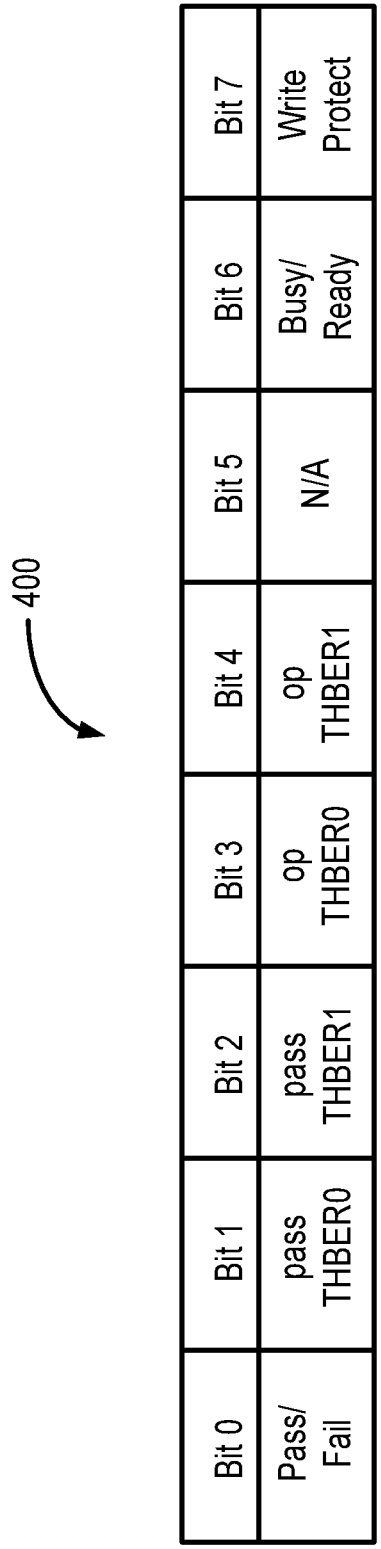
FIG. 4 shows an example read status field register according to embodiments.

FIG. 4 shows an example read status field register 400. The read status field register 400 is an 8 bit register including Bit 0 to Bit 7. In conventional NAND flash devices, Bit 1 to Bit 5 of the read status field register 400 are left unused. Bit 0 is used to indicate whether a program/erase cycle of a block was a success or a failure, Bit 6 indicates whether the device is busy or ready, and Bit 7 indicates whether the device is write protected. The program-verify logic can utilize the unused Bit 1 to Bit 4 to indicate the estimated under and over-programmed BER values. A process running on the controller or a device coupled to the NAND flash device can read the read status field register 400 by sending a READ STATUS command to the NAND. By storing the estimated under and over-programmed BER values in the read status field register 400, a process or the controller can read the estimated BER values without having to issue additional commands. This is because, subsequent to a program command, the controller normally issues a READ STATUS command to read the read status field register 400 to examine the value of Bit 0 (pass/fail), Bit 6 (busy/ready), and Bit 7 (write protect). The program-verify logic, upon receiving a READ STATUS command, can respond with the contents of the read status field register 400. As the read status field register 400 also includes the estimated BER values in the unused bits (i.e., Bit 1-Bit 5), the estimated BER values are made available in response to the same READ STATUS command. As a result, the controller or another program does not have to issue any additional commands (such as, e.g., a READ BER STATUS command) to acquire the estimated BER values, thereby improving the speed of operation of the NAND flash device.

As shown in FIG. 4, the program-verify logic can update the Bit 1 and Bit 2 with the two bits of the under-programmed BER estimate value (passTHBER0 and passTHBER1), and can update Bit 3 and Bit 4 with the two bits of the over-programmed BER estimate value (opTHBER0 and opTHBER1).

As discussed above, the program-verify logic can determine the under-programmed BER estimate and the under-programmed BER estimate for all the voltage thresholds. In some implementations, the program-verify logic can determine additional BER estimates. For example, the program-verify logic can determine a BER estimate across all voltage thresholds. The BER estimate across all thresholds can be determined by determining the greater of the under-programmed BER estimate and the over-programmed BER estimate. In some other implementations, the program-verify logic can use the following Equation (3) to determine the BER estimate across all thresholds:

$$THBER = \max_{th=0...6}\{opTHBER(th) + passTHBER(th)\} \quad (3)$$

Equation 3 determines the BER estimate across all voltage thresholds by determining the greatest sum, across all voltage thresholds, of the over-programmed BER estimate and the under-programmed BER estimate.

In one or more embodiments, the program-verify logic can determine BER estimates separately for each page type. For example, referring to FIG. 2, the LSB page bits can be read by reading the voltage thresholds $T_2$ and $T_6$. Therefore, the estimated BER for the LSB page bits can be the sum of the under-programmed BER estimate and the over-programmed BER estimate for the voltage thresholds $T_2$ and $T_6$. Similarly, the estimated BER for the CSB page bits is the sum of the under-programmed BER estimate and the over-programmed BER estimate for the voltage thresholds $T_1$, $T_3$, and $T_5$; and the estimated BER for the MSB page bits is the sum of the under-programmed BER estimate and the over-programmed BER estimate for the voltage thresholds $T_0$ and $T_4$. Equations (4), (5) and (6) below describe these estimates.

$$BER_{LSB} = \Sigma_{th=2,6} opTHBER(th) + passTHBER(th) \quad (4)$$

$$BER_{CSB} = \Sigma_{th=1,3,5} opTHBER(th) + passTHBER(th) \quad (5)$$

$$BER_{MSB} = \Sigma_{th=0,4} opTHBER(th) + passTHBER(th) \quad (6)$$

In some implementations, the program-verify logic can update the status register shown in FIG. 4 with the BER estimate of the LSB, CSB, or the MSB page. In some implementations, the program-verify logic can update other registers to indicate the BER estimates.

The various BER estimates discussed above can be utilized by the controller or another program running on the controller for various purposes. For example, the BER estimates can be utilized for adaptation of programming parameters by a program digital signal processor or during tuning of default parameters during NAND flash device production.

In one implementation, adaptive programming of a NAND flash memory device can be done at the manufacturing stage, for example, the NAND programming parameters (e.g., any or all of the parameters Vbias, Vstep, Vstart, and NPP described above) are set to their default values. Thereafter, during operation of the memory device, the controller monitors the number of P/E cycles experienced by each block of the memory. This can be done by keeping a count of the actual number of P/E cycles that the memory has undergone. Alternatively, an equivalent P/E cycles count can be estimated according to the last programming result. The estimate can be based on the average programming time and/or on the number of errors following the programming operation. In some cases there may be a strong correspondence between the number of errors during the programming, and the wear level. Example methods for estimating the effective P/E cycles that can be used in the present embodiments are disclosed in U.S. Patent Publ. No. 2012/0216085, the contents of which are incorporated herein by reference in their entirety.

The number of P/E cycles for the memory is compared to a threshold, and if the threshold is exceeded, the programming parameters for the memory are adapted. For example, the programming parameters can be adapted every 1000 cycles, or any other suitable number of cycles. It should be noted that there can be many ways that monitoring and adapting a memory device can be performed, perhaps depending on the composition of the particular memory device. Where the memory device includes or is composed of only a single die comprising a plurality of blocks, in one possible embodiment, the number of cycles is monitored and adaptation is performed for each block separately. In another possible embodiment, adaptation is triggered whenever a single block reaches the threshold number of cycles, and adapting parameters is performed for only a single representative block or all blocks separately. Alternatively, where the memory device includes a plurality of dies, with each die including a plurality of blocks, monitoring and adaptation of programming parameters can be performed for each die separately. However, within each die, monitoring and adaptation can be performed for single representative blocks or each block separately as described in any of the single die example embodiments above.

Figure 5:
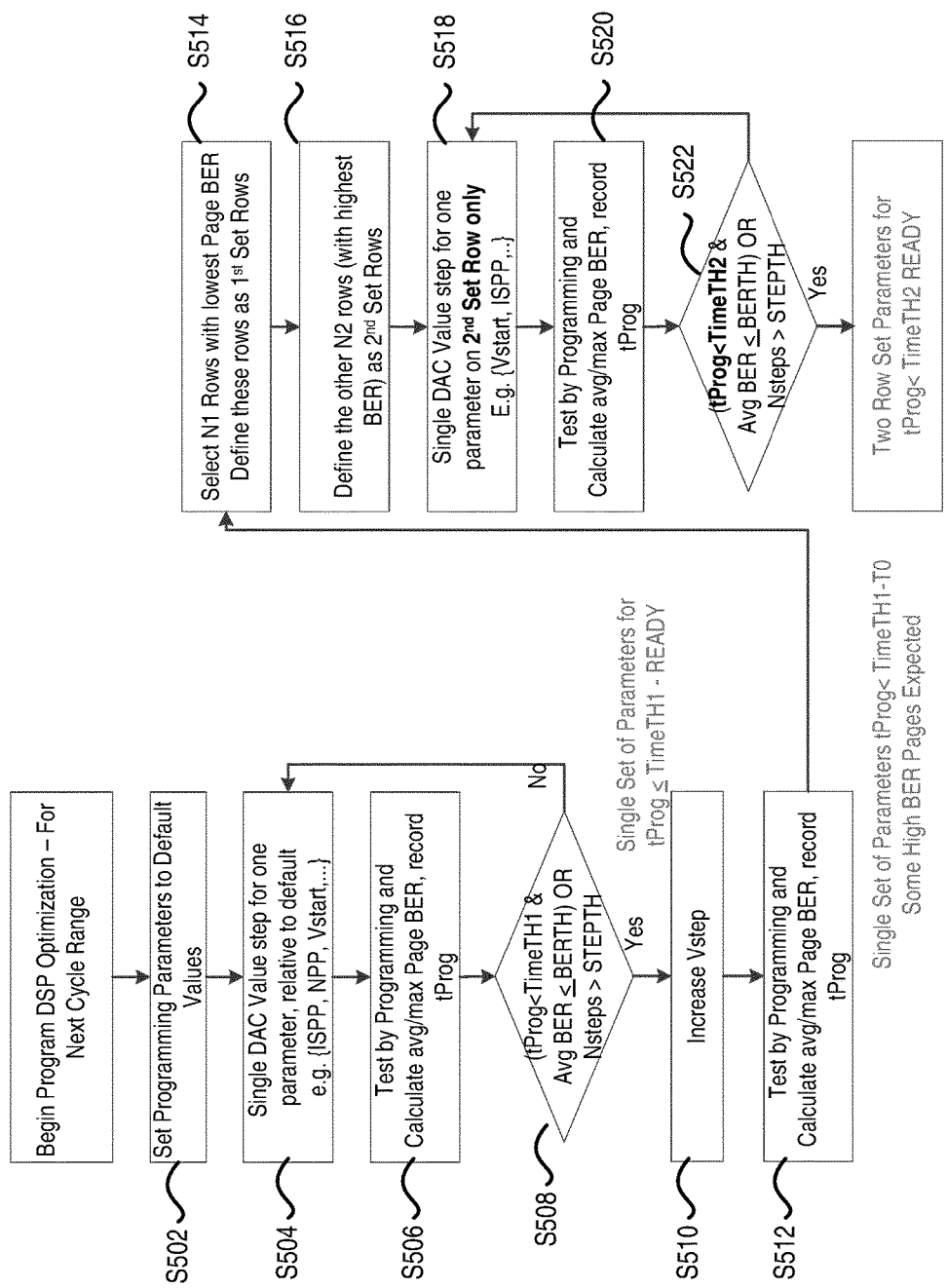
FIG. 5 shows one example method for programming parameters adaptation according to embodiments.

FIG. 5 shows one example method for programming parameters adaptation as discussed above. In this example, the process begins in step S502 by setting the NAND programming parameters (e.g., any or all of the parameters Vbias, Vstep, Vstart, and NPP described above) to their default values (e.g. parameters set by the manufacturer), or any other predetermined initial values.

In step S504, the optimization includes changing one or more of the programming parameters by a fixed step size (for example, measured in DAC values). In some embodiments, only one parameter is changed at each interval while the other parameters remain fixed. In other embodiments, all of the parameters are incrementally changed at the same time. The change in parameters can initially be made in a direction that should be expected to lower the BER. For example, the programming parameter Vstep for the programming pulse voltage step can be increased by a fixed amount. In subsequent steps, other parameters such as Vstart can be increased by designated steps of one DAC value or more. The change can be made in a direction that can be expected to assist in satisfying the thresholds described in connection with step S508, as will become more apparent from the below.

In step S506, after the change of programming parameters, an entire flash memory block is programmed (i.e. all of the pages/rows of a block) using those changed parameters, and the controller measures the programming time tProg. The controller also reads the BER estimate from the read-status register that is provided by the program-verify logic as described above.

In step S508, it is determined if all programming performance conditions are met. In this example, the programming performance conditions are that average tProg must be less than a threshold programming time TimeTH1 and the average BER over all pages of the block must be below a target defined by BERTH. If both of the performance conditions are not met, and if the number of optimization steps does not exceed a threshold number STEPTH, flow returns to S504 where the programming parameters are changed in a direction that would be expected to improve the chances of the programming performance conditions being met at the next step. The determination of the average BER over all pages of the block can be determined as discussed above in relation to FIGS. 1-4. In particular, the process can read the status register shown in FIG. 4 to determine the under-programmed BER estimate and the over-programmed BER estimate, and determine the BER over all pages of the block using Equations (3)-(6). As the BER estimation is based on reading a status register as opposed to reading the complete block and comparing the read data with stored data, the determination of the average BER is relatively faster. As a result the adaptation of the parameters can be performed relatively quickly, thereby improving the performance of the NAND flash device.

At this point after S508, a single set of programming parameter values (e.g., values of the parameters Vbias, Vstep, Vstart, and NPP described above) has been obtained with a modified tProg corresponding to the target programming time TimeTH1. This tProg can be higher or lower than the default tProg, according to system requirements, as will become more apparent from the descriptions below. However, it should be apparent that this will cause the programming time for the memory block to be more stable across the lifespan of the device.

In some embodiments, the programming parameter adaptation process for the entire memory block at this cycle range can end at this point. In other embodiments, further adaptation is performed to obtain stable programming performance between row-sets in the memory block.

Returning to FIG. 5, the next adaptation flow beginning in step S510 in these embodiments is to change only a single programming parameter such as the pulse voltage step Vstep, or any other programming parameter change that accelerates the average tProg by another T0 below TimeTH1. Usually, the change in Vstep which lowers the programming time also increases average BER and maximal BER for the block quite significantly.

More particularly, for example, in a next step S512, the entire flash memory block is programmed (i.e. all of the pages/rows of a block) using the set of programming parameters obtained after step S508, except with the increased Vstep parameter from step S510. After programming, the controller measures the BER of every page using the process described above in connection with step S508, for example.

In a next step S514, the set of N1 rows of the block with the lowest BER as determined in step S512 is identified. A second row-set of the block with the higher BER includes N2 rows, as identified in step S516.

In this example, a next step S518 is to perform an adaptation of the programming parameters for only the second set of N2 rows. As in step S504, this includes changing one or more of the programming parameters by a fixed step size (for example, measured in DAC values), for example in a direction which should lower BER of the N2 rows.

The next step S520 includes performing a full block programming, where the programming parameters for the first set of N1 rows are fixed with their values from the first adaptation after step S508, while the programming parameters for the other set of N2 rows are modified as in step S518.

As determined in S522, similarly as in step S508, when all programming performance conditions are met, the optimization terminates. In this example, the programming performance conditions include that the average tProg for the entire block must be lower than a threshold TimeTH2, and the average BER for the block must be lower than a target BERTH. If both conditions are not satisfied, and if the number of optimization steps does not exceed STEPTH, the flow returns to step S518. If the number of steps exceeds STEPTH, then the optimization of the N2 rows fails, and the controller may revert the programming parameters for those rows to the previous successful set or parameters from step S508, or to the NAND default parameters.

It should be noted that the above methodology for adapting row-sets is not limited to identifying only two row-sets N1 and N2, and only separately adapting two row sets. Rather, the adaptation process can be performed separately for as many row-sets as desired.

Additionally or alternatively, in case the program time change and its corresponding BER have the same typical values on all devices of same process node, it may be possible to use a pre-defined set of row-sets, and thus avoid the need to estimate the BER for selection of the row sets.

By providing the estimated BER during the program/erase cycle, the parameter adaptation process shown in FIG. 5 can be completed relatively faster compared to other approaches where the controller would have to read the block data and compare the block data to stored data to estimate BER.

Figure 6:
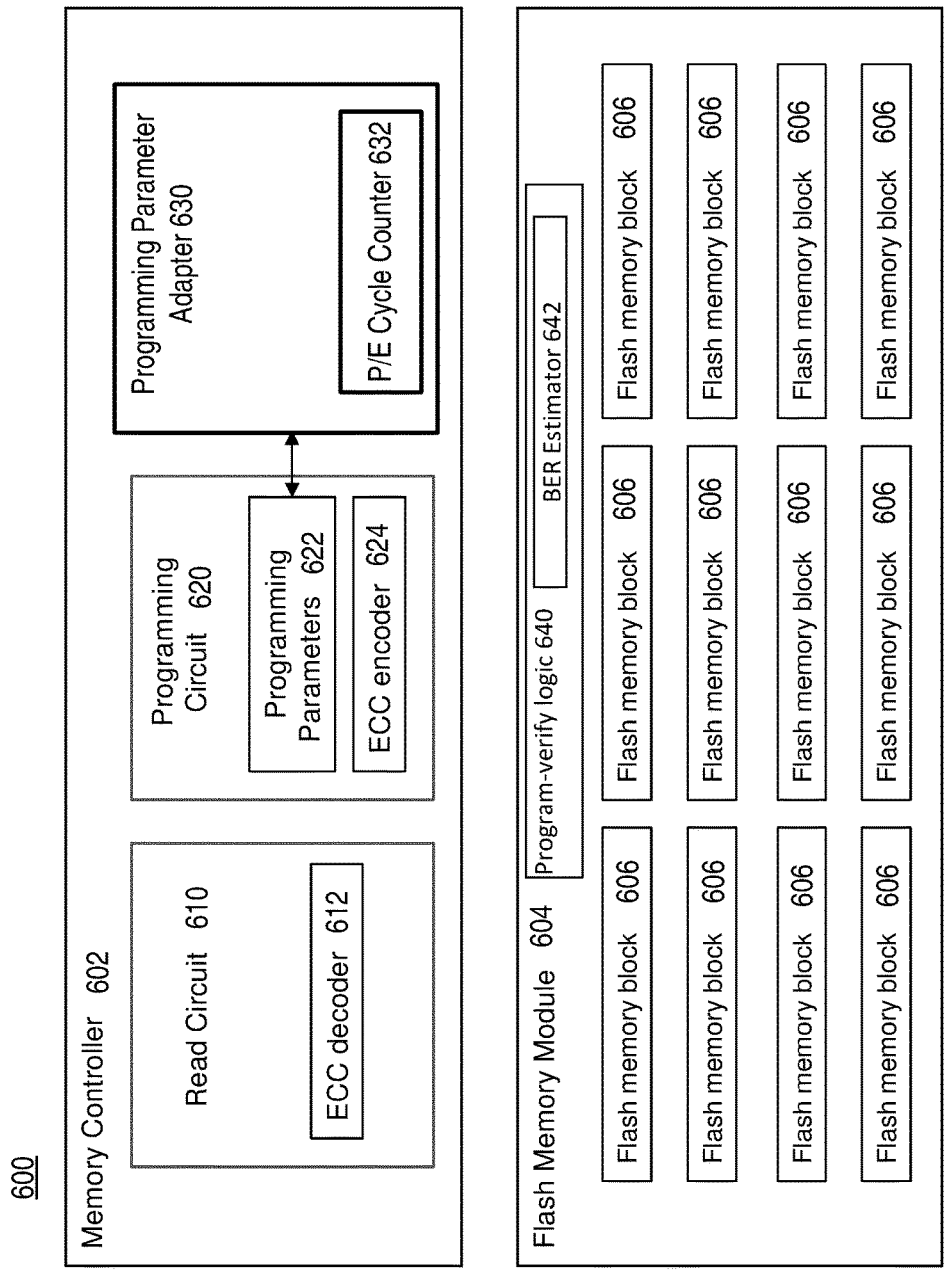
FIG. 6 is a block diagram illustrating an example flash memory device according to embodiments.

FIG. 6 illustrates an example device 600 according to one possible embodiment, which can perform any of the methods described above or a combination thereof.

Device 600 includes a flash memory module 604 and a memory controller 602. The flash memory module 604 includes multiple flash memory blocks 606, each of which includes multiple flash memory rows/pages (not shown). Additionally or alternatively, module 604 can comprise or be implemented using a plurality of dies, each of the dies containing a plurality of the blocks 606.

The memory controller 602 includes a read circuit 610, a programming circuit (e.g. a program DSP) 620 and a programming parameter adapter 630. Adapter 630 can adapt the programming parameters 622 used by programming circuit 620 as described above. Adapter 630 in this example includes a P/E cycle counter 632, which can perform any of the cycle counting or estimation techniques described above. Although shown separately for ease of illustration, some or all of adapter 630 can be incorporated in programming circuit 620. In accordance with some aspects of the embodiments described above, read circuit 610 includes an ECC decoder 612 and programming circuit 620 includes an ECC encoder 624. Embodiments of memory controller 602 can include additional or fewer components such as those shown in FIG. 6.

The flash memory module 604 also includes program-verify logic 640, which further includes a BER estimator 642, which can function according to the discussion above in relation to FIG. 1-5. The program-verify logic 640 can also include a read-status register (not shown), which the BER estimator 642 can update after a programming operation as described above, and which can be accessed by the memory controller (e.g. by programming circuit 620).

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of steps in the processes disclosed is an example of illustrative approaches. Based upon design preferences, it is understood that the specific order or hierarchy of steps in the processes may be rearranged while remaining within the scope of the previous description. The accompanying method claims present elements of the various steps in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the steps of various examples must be performed in the order presented. As will be appreciated by one of skill in the art the order of steps in the foregoing examples may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In some exemplary examples, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A method comprising:
   performing a program operation on a multi-level cell flash memory having a plurality of threshold voltages;
   for each threshold voltage:
      programming a state immediately greater than the threshold voltage,
      defining at least one verify threshold value,
      determining a first number of cells having voltage less than the at least one verify threshold value, and
      determining an estimated under-programmed bit error rate (BER) based on the first number of cells and a first BER threshold value; and
   determining an overall under-programmed BER based on the estimated under-programmed BER for each threshold voltage of the plurality of threshold voltages.

2. The method of claim 1, wherein determining the overall under-programmed BER includes equating the overall under-programmed BER to a highest estimated under-programmed BER from the estimated under-programmed BERs for the plurality of threshold voltages.

3. The method of claim 1, wherein for each threshold voltage, determining the estimated under-programmed BER includes determining that the first number of cells is greater than the first BER threshold value and equating the estimated under-programmed BER to an assigned BER of the at least one verify threshold value.

4. The method of claim 1, wherein for each threshold voltage, defining at least one verify threshold value includes defining a first verify threshold value that is less than the threshold voltage, defining a second verify threshold value that is equal to the threshold voltage, and defining a third verify threshold value that is greater than the threshold voltage.

5. The method of claim 1, further comprising:
for each threshold voltage:
programming a state immediately less than the threshold voltage,
determining a second number of cells having voltages greater than the at least one verify threshold value,
determining an estimated over-programmed BER based on the second number of cells and a second BER threshold value,
determining an overall over-programmed BER based on the estimated over-programmed BER for each threshold voltage of the plurality of threshold voltages.

6. The method of claim 5, wherein determining the overall over-programmed BER includes equating the overall over-programmed BER to a highest estimated over-programmed BER from the estimated over-programmed BERs for the plurality of threshold voltages.

7. The method of claim 5, wherein for each threshold voltage, determining the estimated over-programmed BER includes determining that the second number of cells is greater than the second BER threshold value and equating the estimated over-programmed BER to an assigned BER of the at least one verify threshold value.

8. The method of claim 5, wherein overall under-programmed BER and the overall over-programmed BER are binary values, and wherein the method further comprises storing the overall under-programmed BER and the overall over-programmed BER in a status read register of the multi-level cell flash memory.

9. A method of claim 8, comprising:
performing a program operation on a multi-level cell flash memory having a plurality of threshold voltages;
for each threshold voltage:
programming a state immediately greater than the threshold voltage,
defining at least one verify threshold value,
determining a first number of cells having voltage less than the at least one verify threshold value, and
determining an estimated under-programmed bit error rate (BER) based on the first number of cells and a first BER threshold value;
determining an overall under-programmed BER based on the estimated under-programmed BER for each threshold voltage of the plurality of threshold voltages;
for each threshold voltage:
programming a state immediately less than the threshold voltage,
determining a second number of cells having voltages greater than the at least one verify threshold value, and
determining an estimated over-programmed BER based on the second number of cells and a second BER threshold value;
determining an overall over-programmed BER based on the estimated over-programmed BER for each threshold voltage of the plurality of threshold voltages,
wherein the overall under-programmed BER and the overall over-programmed BER are binary values, and wherein the method further comprises storing the overall under-programmed BER and the overall over-programmed BER in a status read register of the multi-level cell flash memory; and
receiving a request to provide contents of the status read register, and responsive to the request providing the contents of the status read register including the overall under-programmed BER, the overall over-programmed BER, a program pass/fail status, a write protect status, and a busy/read status.

10. The method of claim 5, further comprising determining an overall BER based on the greater one of the overall under-programmed BER and the overall over-programmed BER.

11. The method of claim 1, wherein defining at least one verify threshold value includes selecting a number the at least one verify threshold values based on a desired accuracy of the estimated under-programmed BER for each threshold voltage of the plurality of threshold voltages.

12. A flash memory system comprising:
a multi-level cell flash memory having a plurality of threshold voltages; and
a circuit configured to perform programming operations on the multi-level cell flash memory, the circuit including a bit error rate (BER) estimator configured to:
for each threshold voltage:
program a state immediately greater than the threshold voltage,
define at least one verify threshold value,
determine a first number of cells having voltages less than the at least one verify threshold value, and
determine an estimated under-programmed BER based on the first number of cells and a first BER threshold value; and
determine an overall under-programmed BER based on the estimated under-programmed BER for each threshold voltage of the plurality of threshold voltages.

13. The flash memory system of claim 12, wherein to determine the overall under-programmed BER includes to equate the overall under-programmed BER to a highest estimated under-programmed BER from the estimated under-programmed BERs for the plurality of threshold voltages.

14. The flash memory system of claim 12, wherein for each threshold voltage, to determine the estimated under-programmed BER includes to determine that the first number of cells is greater than the first BER threshold value and to equate the estimated under-programmed BER to an assigned BER of the at least one verify threshold value.

15. The flash memory system of claim 12, wherein for each threshold voltage, to define at least one verify threshold value includes to define a first verify threshold value that is less than the threshold voltage, defining a second verify threshold value that is equal to the threshold voltage, and defining a third verify threshold value that is greater than the threshold voltage.

16. The flash memory system of claim 12, wherein the BER estimator is further configured to:
for each threshold value:
program a state immediately less than the threshold voltage, determine a second number of cells having voltages greater than the at least one verify threshold value, determine an estimated over-programmed BER based on the second number of cells and a second BER threshold value, and determine an overall over-programmed BER based on the estimated over-programmed BER for each threshold voltage of the plurality of threshold voltages.

17. The flash memory system of claim 16, wherein to determine the overall over-programmed BER includes to equate the overall over-programmed BER to a highest estimated over-programmed BER from the estimated over-programmed BERs for the plurality of threshold voltages.

18. The flash memory system of claim 16, wherein for each threshold voltage, to determine the estimated over-programmed BER includes to determine that the second number of cells is greater than the second BER threshold value and to equate the estimated over-programmed BER to an assigned BER of the at least one verify threshold value.

19. The flash memory system of claim 16, wherein overall under-programmed BER and the overall over-programmed BER are binary values, and wherein the BER estimator is further configured to store the overall under-programmed BER and the overall over-programmed BER in a status read register of the multi-level cell flash memory.

20. The flash memory system of claim 19, wherein the status read register also include bits indicating a program pass/fail status, a write protect status, and a busy/read status of the multi-level cell flash memory.

21. The flash memory system of claim 20, wherein the BER estimator is further configured to receive a request for contents of the status read register, and responsive to the request, provide the contents of the status read register including the bits indicating the program pass/fail status, the write protect status, the busy/read status, the overall under-programmed BER, and the overall over-programmed BER.

22. The flash memory system of claim 16, wherein the BER estimator is further configured to determine an overall BER based on the greater one of the overall under-programmed BER and the overall over-programmed BER.

23. The flash memory system of claim 12, wherein the multi-level cell flash memory is a NAND-type flash memory.

24. The flash memory system of claim 12, wherein the BER estimator is configured to define a number of the at least one verify threshold value based on a desired accuracy of the estimated over-programmed BER for each threshold voltage of the plurality of threshold voltages.

* * * * *